(12) United States Patent
Mock et al.

(10) Patent No.: US 7,148,564 B2
(45) Date of Patent: Dec. 12, 2006

(54) DUAL-SIDED SUBSTRATE INTEGRATED CIRCUIT PACKAGE INCLUDING A LEADFRAME HAVING LEADS WITH INCREASED THICKNESS

(75) Inventors: Roger A Mock, Kokomo, IN (US); Erich W. Gerbsch, Cicero, IN (US)

(73) Assignee: Delphi Technologies, Inc., Troy, MI (US)

( * ) Notice: Subject to any disclaimer, the term of this patent is extended or adjusted under 35 U.S.C. 154(b) by 132 days.

(21) Appl. No.: 10/780,163

(22) Filed: Feb. 17, 2004

(65) Prior Publication Data

US 2005/0179123 A1    Aug. 18, 2005

(51) Int. Cl.
 *H01L 23/48* (2006.01)
 *H01L 23/495* (2006.01)
 *H01L 23/498* (2006.01)

(52) U.S. Cl. ............... 257/696; 257/E23.063; 257/673; 257/676; 257/734; 257/775; 257/776; 257/691; 257/E23.066; 257/666; 257/698

(58) Field of Classification Search ........ 257/666–678, 257/734, 737, 738, 778, 698, 691, 775, 776, 257/E23.063, E23.066
See application file for complete search history.

(56) References Cited

U.S. PATENT DOCUMENTS 5,166,098 A * 11/1992 Micic et al. ............. 29/855
5,767,570 A * 6/1998 Rostoker ............... 257/668
6,084,291 A * 7/2000 Fujimori ............... 257/668
6,232,148 B1 * 5/2001 Ma et al. ............... 438/112
6,307,755 B1 * 10/2001 Williams et al. ........... 361/813
6,459,148 B1 * 10/2002 Chun-Jen et al. .......... 257/692

FOREIGN PATENT DOCUMENTS

| JP | 5-47980 | * 2/1993 |
| JP | 6-252334 | * 9/1994 |
| JP | 2001-298142 | * 10/2001 |

* cited by examiner

*Primary Examiner*—Alexander Oscar Williams
(74) *Attorney, Agent, or Firm*—Jimmy L. Funke

(57) ABSTRACT

An integrated circuit package includes a first non-conductive substrate having a first inner surface and a second non-conductive substrate having a second inner surface. A die having a first thickness is disposed between the first and second inner surfaces. A leadframe includes a member having a proximal end and a distal end. The proximal end has a second thickness less than the first thickness. The distal end is disposed between the first and second inner surfaces. The distal end is undulated such that the distal end has an effective thickness greater than the second thickness.

5 Claims, 13 Drawing Sheets

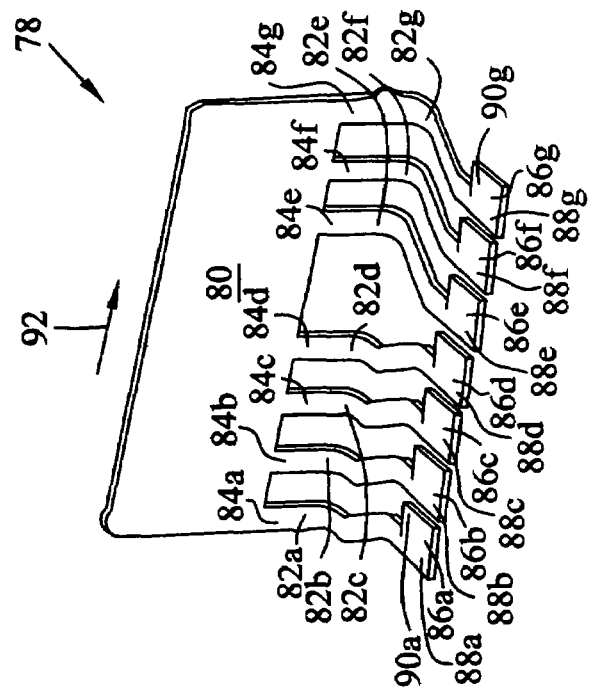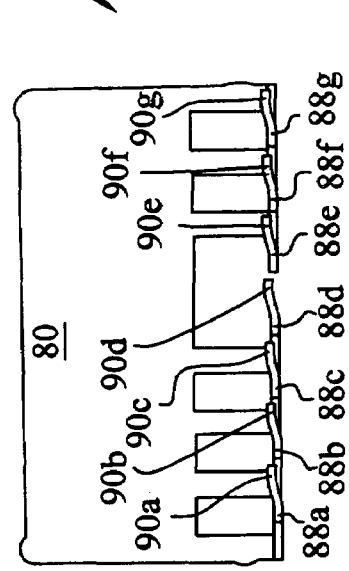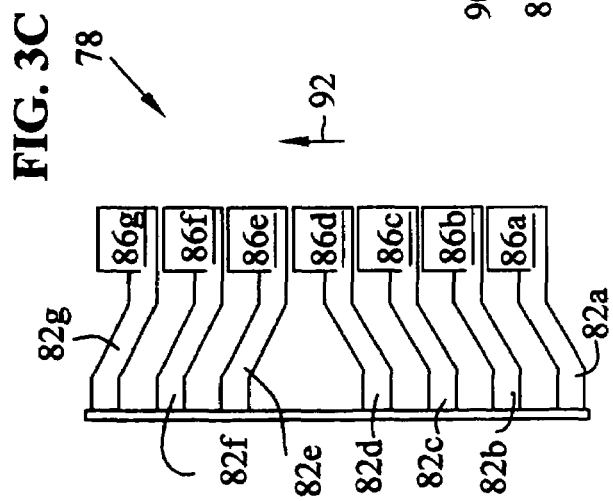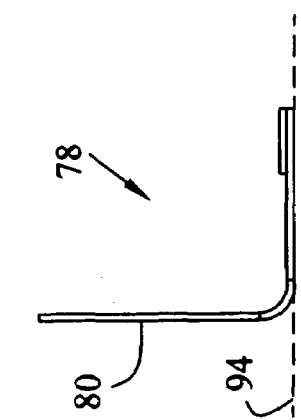
FIG. 3A
FIG. 3B
FIG. 3C
FIG. 3D

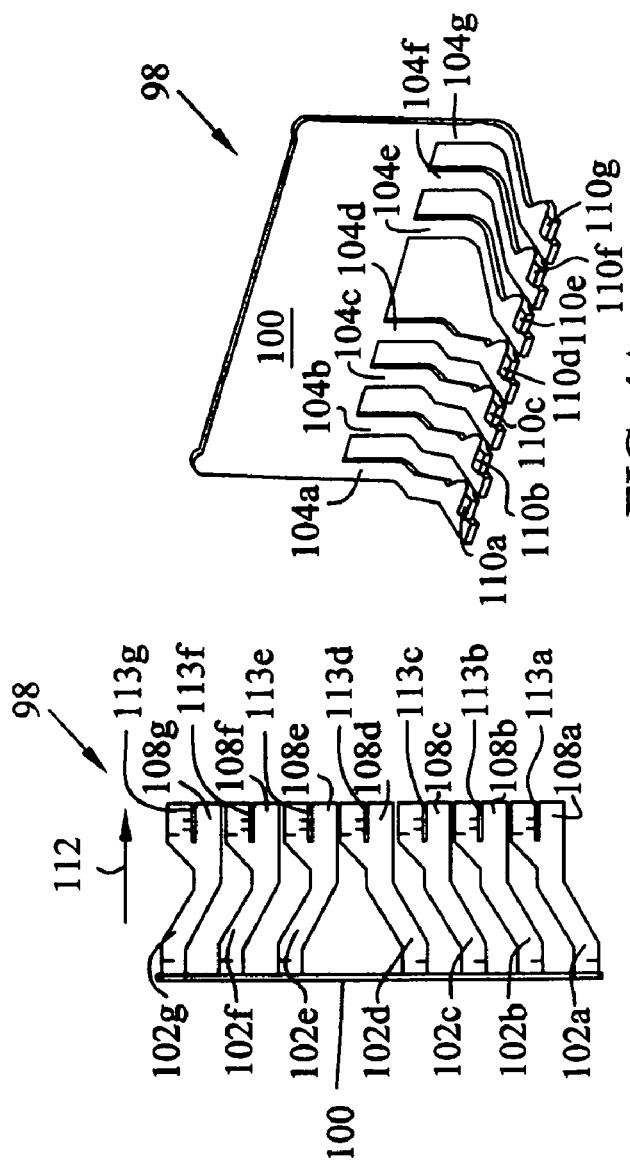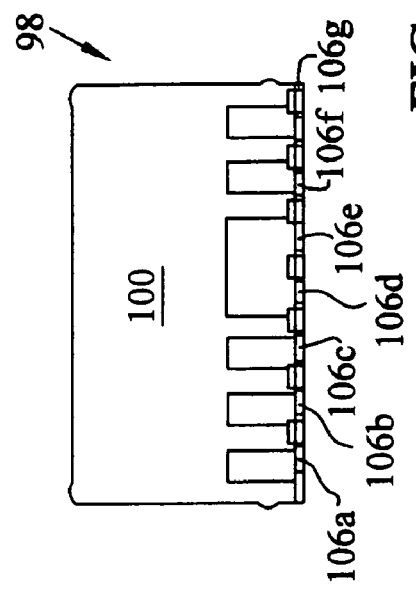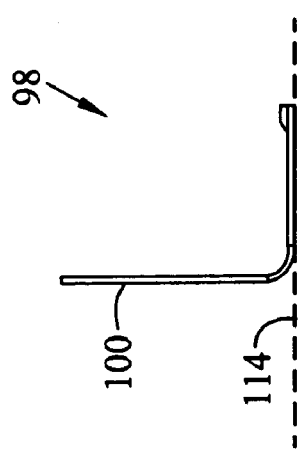

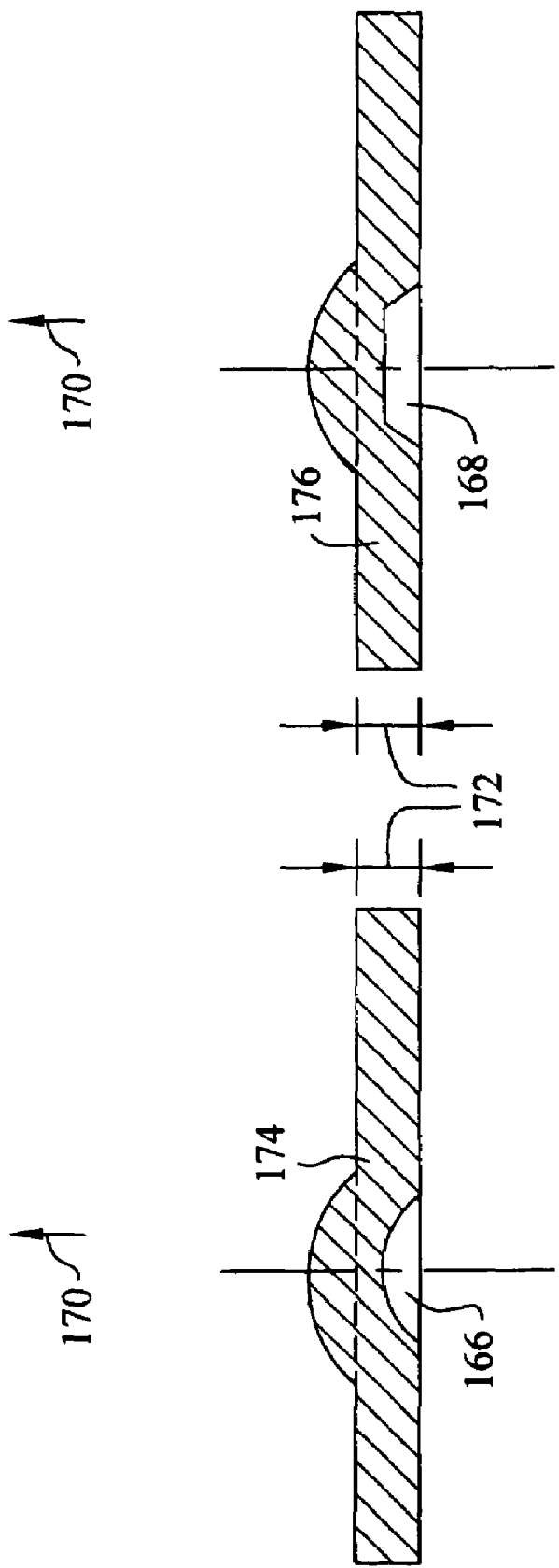

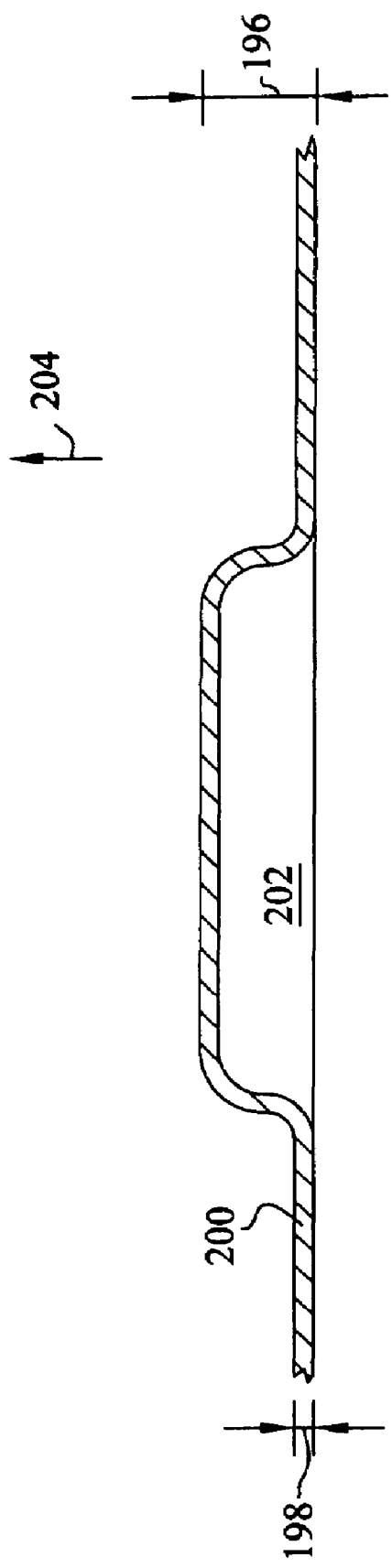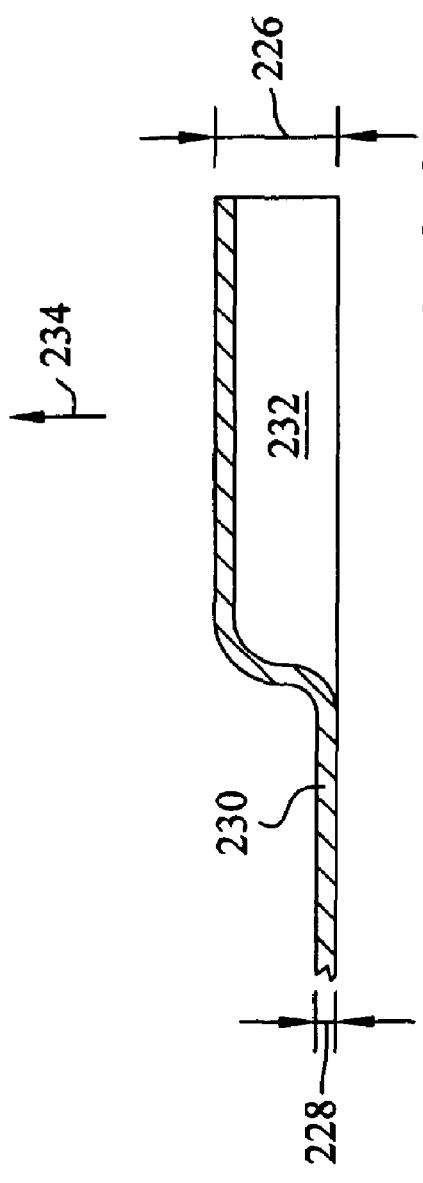

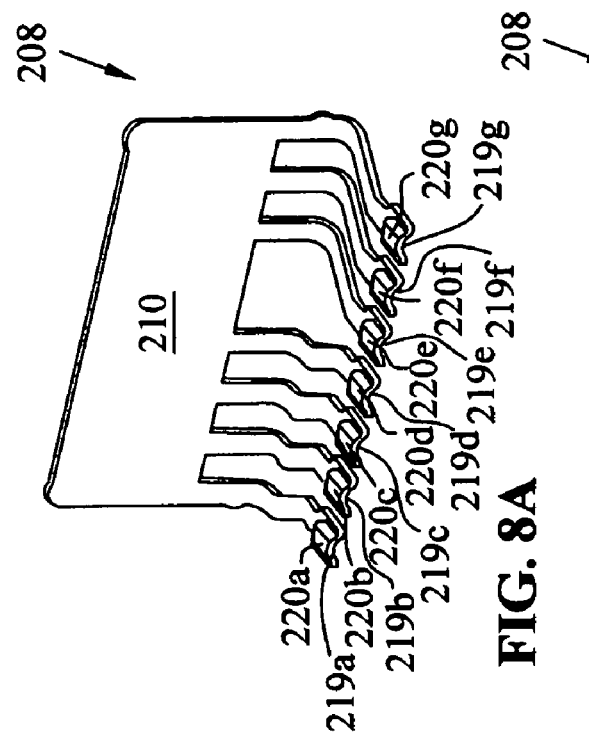
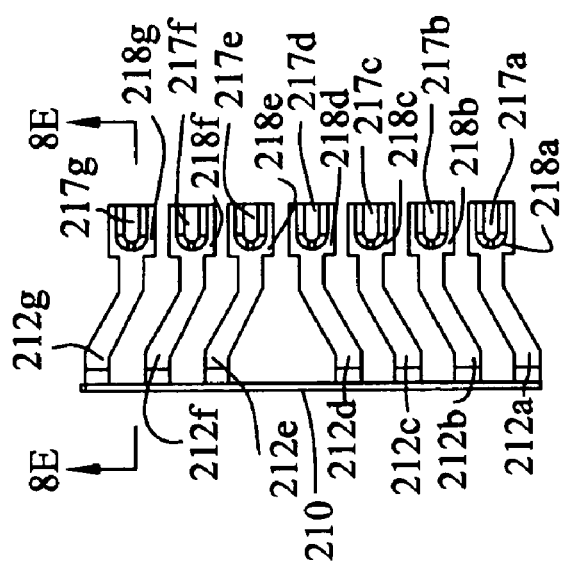
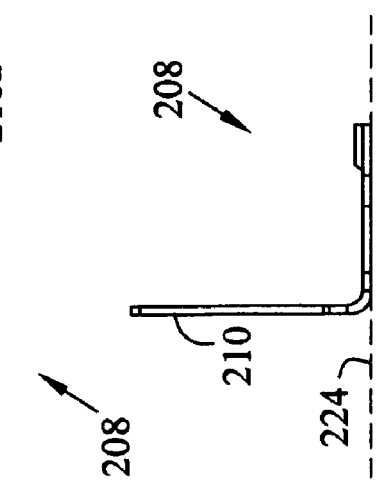

DUAL-SIDED SUBSTRATE INTEGRATED CIRCUIT PACKAGE INCLUDING A LEADFRAME HAVING LEADS WITH INCREASED THICKNESS

TECHNICAL BACKGROUND

This invention relates generally to a dual-sided substrate integrated circuit package, and, more particularly, to a leadframe included in a dual-sided substrate integrated circuit package.

BACKGROUND OF THE INVENTION

Miniaturized electronic components, such as chip transistors, processors, etc., must often be assembled in conjunction with circuits, assemblies or components of comparatively larger dimensions. This can create design and manufacturing challenges when it becomes necessary to place such miniature components in communication with these larger circuits, assemblies or components.

One solution to such manufacturing problems has been through the use of leadframes. A leadframe is a thin layer of metal that connects the wiring from tiny electrical terminals on the semiconductor surface to the large-scale circuitry on electrical devices and circuit boards. Leadframes provide an electrical conduit from the multiple small terminals commonly found on electrical components to larger connector pads wherein additional circuitry may be connected to the component. The leadframes thereby allow practical and cost effective manufacturing techniques to be utilized to "wire in" these miniature components to the remainder of the electronic assembly. The leadframes do so by providing a thin multi-pathway bridge from the plurality of terminals on the miniature components to a plurality of connector pads sized and placed for convenient attachment to neighboring circuits. Leadframes are used in almost all semiconductor packages.

In order to function as a conduit between neighboring electronic components, it is desirable for leadframes to have certain characteristics. Their complex and crowded pathway patterns are often created via manufacturing techniques such as laser or chemical etching. Flexible pathways reduce stresses imparted to the electronic components and can loosen design tolerances necessary to mate with surrounding systems. Shapes and configurations must often balance the needs for flexibility, strength, and size.

The use of dual gauge leadframes can enable the bridging of contacts between multi-level and sandwich style circuit boards, i.e., "substrates", in cases in which the thickness of a die between the circuit boards limits how close the circuit boards can get to one another. The die and the leadframe are both disposed between the circuit boards. Since the thickness of the die is generally greater than that of the leadframe, the leadframe may not be able to bridge the gap between contacts on the circuit boards without some modification to the leadframe. More particularly, the leadframe may need to be provided with an effective thickness that is approximately equal to the thickness of the die.

The leadframe can be provided with a laminate structure to increase its thickness, but a laminate structure requires costly, complex, and time consuming manufacturing processes. In addition, a laminate structure can negatively impact the flexibility of the leadframe and therefore may not be suitable for some assemblies.

Another known technique for increasing the effective height of the leadframe is to fold the distal tip, i.e., "lead", of a leadframe member onto itself, i.e., double over the distal tip of the leadframe member, in order to double the effective thickness of the tip of the leadframe member. The doubled over leadframe member tip can then be flattened, i.e., coined, such that the effective thickness of the leadframe member tip is slightly greater than or approximately equal to the thickness of the silicon die. Each side of the flattened leadframe member tip is attached inside the integrated circuit package in order to maintain the proper vertical spacing between the lower and upper substrates to obtain consistent joint thicknesses for the silicon die attached between the lower and upper substrates.

A problem with the technique of doubling over the leadframe member tip is that it requires either a large progressive die with multiple stages to flatten the leadframe member tip, or an additional secondary die or bending fixture. The press must exert an excessive amount of force to compress, i.e., coin, the doubled over lead tip to less than twice the thickness of the remainder of the leadframe. This tight form on the leads work hardens the base copper and plating material, and can create stress cracks across the hem where the leadframe member tip is doubled over.

What is needed in the art is a leadframe having a member tip with an increased effective thickness, wherein the leadframe is not subject to manufacturing defects and can be inexpensively manufactured without an additional die.

SUMMARY OF THE INVENTION

The present invention provides a leadframe including members having undulated distal tips with increased effective thicknesses. The leadframe is not prone to structural defects, and can be inexpensively manufactured without the need for an additional die.

According to one embodiment of the invention, an integrated circuit package includes a first non-conductive substrate having a first inner surface and a second non-conductive substrate having a second inner surface. A die having a first thickness is disposed between the first and second inner surfaces. A leadframe includes a member having a proximal end and a distal end. The proximal end has a second thickness less than the first thickness. The distal end is disposed between the first and second inner surfaces. The distal end is undulated such that the distal end has an effective thickness greater than the second thickness.

According to another embodiment of the present invention, a lead frame includes a body portion and a plurality of members extending from the body portion. Each member has a proximal end and a distal end. The proximal end has a first thickness. The distal end is undulated such that the distal end has an effective thickness greater than the first thickness.

According to yet another embodiment of the present invention, a method of manufacturing a lead frame includes forming a body portion and a plurality of members extending from the body portion. Each of the members has a proximal end and a distal end. An undulation is formed in each of the distal ends.

An advantage of the present invention is that the leadframes are less prone to defects, less expensive, and easier to manufacture than leadframes having doubled over lead tips or laminate structures. The undulated leadframes of the present invention have substantially less stress on the base copper and plating material than do doubled over leadframes, so there is considerably less risk of stress fractures across the formed edges. The offset formed or corrugated formed leads of the present invention provide more stress relief inside the integrated circuit package than do flat or doubled over leads.

Another advantage is that the stock width of the coiled or strip copper material used to make the leadframes can be narrower and less expensive than that used to make leadframes having doubled over lead tips. Thus, the present invention provides a reduction of scrap copper material blanked from the progressive die Yet another advantage is that the progressive die can be smaller, more inexpensive to build, and less complicated by virtue of having fewer components and because all of the leads can be formed in one stage. The smaller progressive die can be run in a smaller press with less tonnage, which is more economical to operate.

A further advantage is that there is no need for a secondary die or bending fixture. Less force is required to undulate the leadframe member because the thickness of the leadframe material is not substantially compressed.

A still further advantage is that the effective thickness of the leadframe member tips can be controlled by the form punches in the progressive die for the leadframe. This allows the thickness of the copper leadframe material to be less than the thickness of the integrated circuit silicon die. Therefore, a standard thickness of copper material can be selected for the leadframe to be used with a variety of silicon die of different thicknesses. This eliminates the need to special order a custom thickness leadframe to match a specific integrated circuit die thickness per each electronic package application using flat leadframes without doubled over member tips.

BRIEF DESCRIPTION OF THE DRAWINGS

The present invention will now be described, by way of example, with reference to the accompanying drawings, in which:

FIG. 3A is a perspective view of one embodiment of the leadframe of FIG. 1A.

FIG. 3B is a front view of the leadframe of FIG. 3A.

FIG. 3C is a top view of the leadframe of FIG. 3A.

FIG. 3D is a side view of the leadframe of FIG. 3A.

FIG. 4A is a perspective view of another embodiment of the leadframe of FIG. 1A.

FIG. 4B is a front view of the leadframe of FIG. 4A.

FIG. 4C is a top view of the leadframe of FIG. 4A.

FIG. 4D is a side view of the leadframe of FIG. 4A.

FIG. 6E is a cross-sectional view of one embodiment of the distal end of one of the lead frame members of FIG. 6C along line 6EF.

FIG. 6F is a cross-sectional view of another embodiment of the distal end of one of the lead frame members of FIG. 6C along line 6EF.

FIG. 7E is a cross-sectional view of another embodiment of the distal end of one of the lead frame members of FIG. 7C along line 7E.

FIG. 8A is a perspective view of a still further embodiment of the leadframe of FIG. 1A.

FIG. 8B is a front view of the leadframe of FIG. 8A.

FIG. 8C is a top view of the leadframe of FIG. 8A.

FIG. 8D is a side view of the leadframe of FIG. 8A.

FIG. 8E is a cross-sectional view of another embodiment of the distal end of one of the lead frame members of FIG. 8C along line 8E.

Figure 1A:
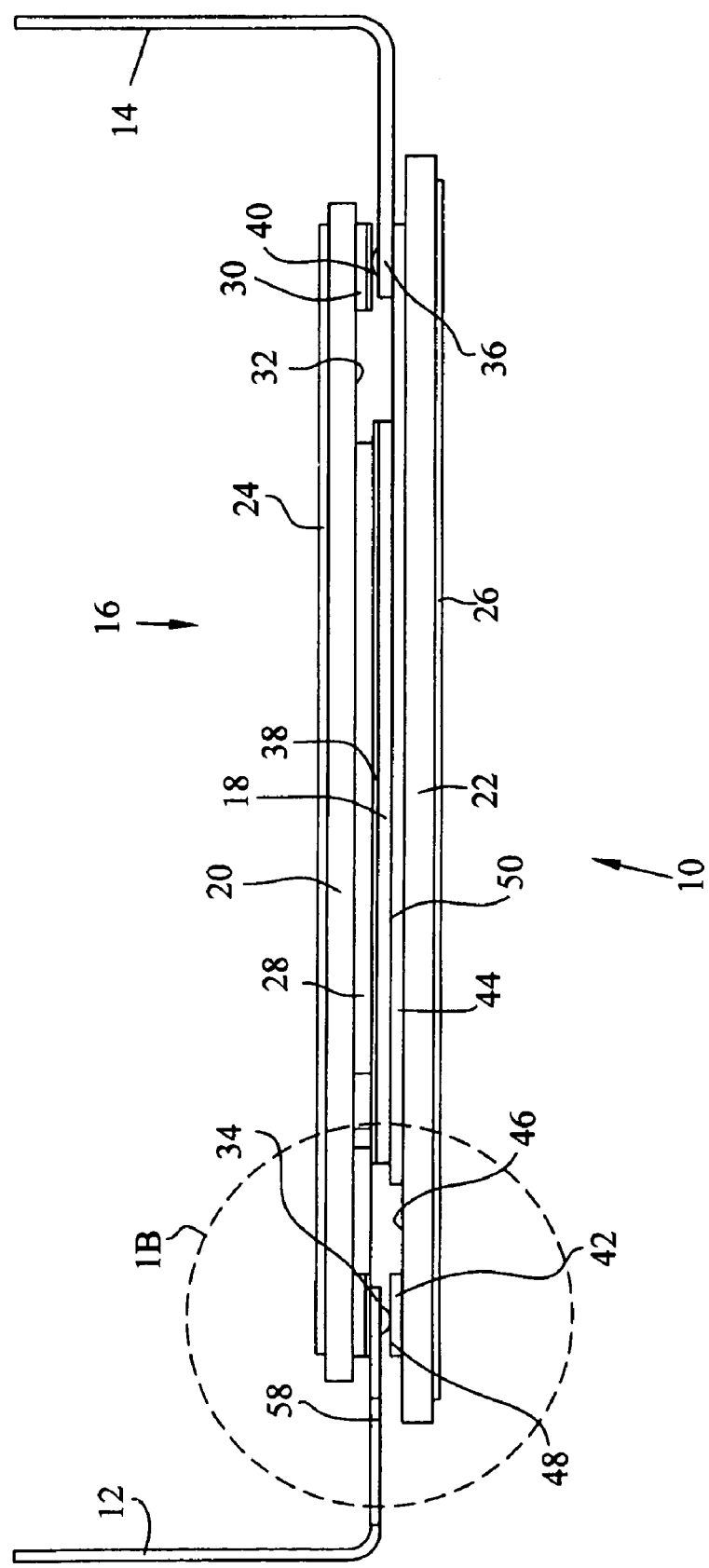
FIG. 1A is a side view of one embodiment of an integrated circuit package of the present invention.

Corresponding reference characters indicate corresponding parts throughout the several views. Although the drawings represent an embodiment of the present invention, the drawings are not necessarily to scale and certain features may be exaggerated in order to better illustrate and explain the present invention. The exemplifications set out herein illustrate an embodiment of the invention and such exemplifications are not to be construed as limiting the scope of the invention in any manner.

DESCRIPTION OF INVENTION

Referring now to the drawings, and particularly to FIG. 1A, there is shown one embodiment of an integrated circuit package 10 of the present invention, including leadframes 12, 14 in electrical communication with an integrated circuit 16. Integrated circuit 16 includes an integrated circuit die 18 formed of a semiconductor material. Die 18 is sandwiched between non-conductive substrates 20, 22, which can be formed of a ceramic material.

Each of substrates 20, 22 can include a respective layer of solderable material 24, 26 on the outer surfaces thereof. Pressure attached applications may not require solderable material 24, 26 on the outer surface. Elimination of solderable material 24 and 26 reduces the thermal resistance and device temperature.

Electrically conductive bonded copper elements 28, 30 are attached to an inner surface 32 of substrate 20. In the particular embodiment shown in FIG. 1A, element 28 is in the form of a substrate, while element 30 may better be described as an electrical contact pad. Each of elements 28, 30 are electrically connected to other circuit elements within package 10, although elements 28, 30 can be electrically isolated from each other. Element 28 is in electrical communication with each of a distal end 34 of leadframe 12 and die 18. Element 30 is in electrical communication with a distal end 36 of leadframe 14.

Figure 1B:
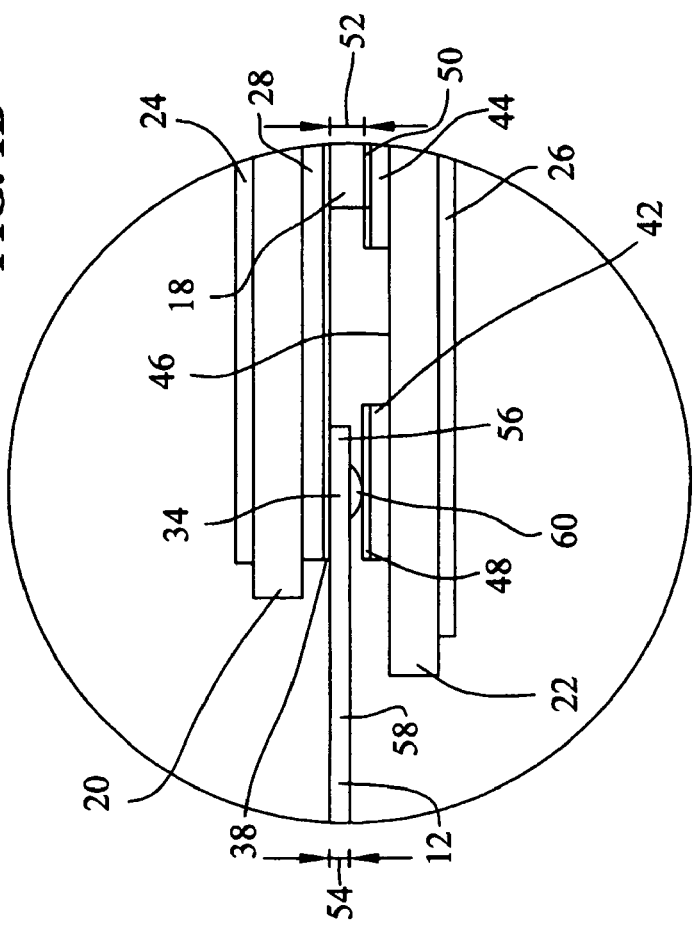
FIG. 1B is an enlarged side view of area B of FIG. 1A.

As best seen in FIG. 1B, there may be a layer 38 of electrically conductive attachment material disposed between element 28 and distal end 34 of leadframe 12. There may also be a layer 40 of electrically conductive attachment material disposed between element 30 and distal end 36 of leadframe 14, as shown in FIG. 1A.

Electrically conductive bonded copper elements 42, 44 are attached to an inner surface 46 of substrate 22. In the particular embodiment shown in FIG. 1A, element 44 is in the form of a substrate, while element 42 may better be described as an electrical contact pad. Each of elements 42, 44 are electrically connected to other circuit elements within package 10, although elements 42, 44 can be electrically isolated from each other. Element 44 is in electrical communication with each of a distal end 36 of leadframe 14 and die 18. Element 42 is in electrical communication with a distal end 34 of leadframe 12.

As best seen in FIG. 1B, there may be a layer 48 of electrically conductive attachment material disposed between element 42 and distal end 34 of leadframe 12. There may also be a layer 50 of electrically conductive attachment material disposed between element 44 and distal end 36 (FIG. 1A) of leadframe 14. The die attachment material of layers 38, 40, 48, 50 may be a type of solder paste, solder preform, ultra-thick thick film (UTTF), or electrically conductive adhesive, for example.

As shown in FIG. 1B, die 18 has a thickness 52 as measured in a vertical direction. The thickness of die 18 limits how close together elements 28, 42 can be placed. More particularly, a distance between layers of attachment material 38, 48 is no less than thickness 52. As also shown in FIG. 1B, a thickness 54 of a base portion 56 of a leadframe member 58 is not sufficiently large to perform any necessary bridging of the gap between layers of attachment material 38, 48. That is, it may be necessary for leadframe 12 to be in electrical communication with each of elements 28, 42.

In accordance with the present invention, distal end 34 of leadframe member 58 is provided with an undulation 60 that, together with base portion 56, provides distal end 34 with a thickness greater than that of base portion 56 alone. Preferably, undulation 60 together with base portion 56 provides distal end 34 with a thickness approximately equal to or slightly greater than thickness 52 of die 18. Thus, distal end 34 can simultaneously contact conductive attachment layers 38, 48 as well as enable desired thicknesses of layers 38, 48 to be maintained. An undulation such as undulation 60 may be provided below base portion 56, as is the case with leadframe 12. Alternatively, an undulation may be provided above base portion 56, as is the case with leadframe 14 as shown in FIG. 1A.

Figure 2:
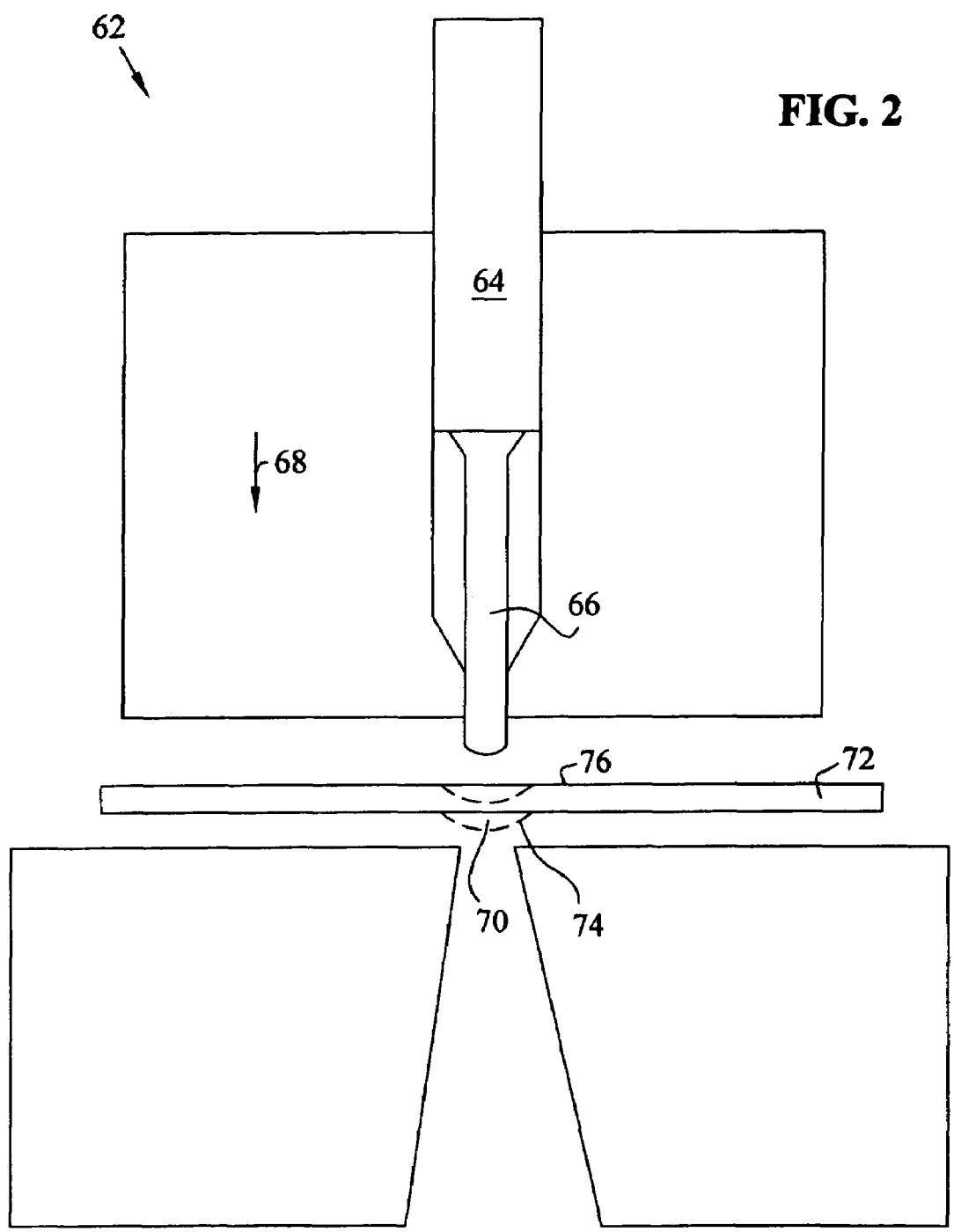
FIG. 2 is a plan view of one embodiment of a progressive die that can be used in forming the leadframe of the integrated circuit package of FIG. 1A.

A progressive die machine 62 that can be used in forming undulations such as undulation 60 is shown in FIG. 2. Machine 62 includes a piston 64 that can drive a punch 66 in direction 68 to extrude or otherwise create an undulation 70 in an otherwise planar sheet 72 of copper stock from which a leadframe can be formed. The surface area of a "crest" 74 of undulation 70 as well as the effective thickness between crest 74 and an opposite base portion surface 76 can be controlled by the size and type of punch 66 and by the level of force with which punch 66 is driven. Also, a solid die section (not shown) could be used to further control the size, shape, and thickness of undulation 70. Progressive die machine 62, or a similar progressive die machine, can be used to form or punch out the entire leadframe from a sheet of copper stock.

Various embodiments of a leadframe of the present invention including a member having an undulated distal end will now be described with reference to FIGS. 3–8. Each of the leadframe embodiments is suitable for use in conjunction with integrated circuit 16. It should be understood that although all of the leadframes of FIGS. 3–8 are shown with upwardly extending undulations, they can be easily modified within the scope of the invention to extend in a downward direction, i.e., in a direction away from the leadframe body.

FIGS. 3A–D illustrate one embodiment of a leadframe 78 of the present invention including a body 80 and a plurality of members 82a–g having proximal ends 84a–g and distal ends or "leads" 86a–g. Each of leads 86a–g is offset formed such that the leads ramp up from the level of base portions 88a–g to a slightly higher vertical level, thereby providing leads 86a–g with undulations 90a–g. Undulations 90a–g and base portions 88a–g provide distal ends 86a–g with effective thicknesses greater than the thicknesses of base portions 88a–g alone. Each of leads 86a–g has a width in direction 92 that is greater than the width of the respective one of proximal ends 84a–g. Thus, there is ample width for leads 86a–g to ramp up to a desired vertical level without too steep of a slope.

As best seen in FIG. 3D, while considering FIGS. 3A–3C, each of members 82a–g is bent at an angle of 90° such that distal ends 86a–g of members 82a–g extend in a direction perpendicular to body 80. As also seen in FIG. 3D, members 82a–g define an imaginary plane 94. As best seen in FIG. 3C, each of members 82a–g follows a bending path, i.e., is nonlinear, in a direction within plane 94.

FIGS. 4A–D illustrate another embodiment of a leadframe 98 of the present invention including a body 100 and a plurality of members 102a–g having proximal ends 104a–g and distal ends or "leads" 106a–g. Each of leads 106a–g is offset formed such that the leads ramp up from the level of base portions 108a–g to a slightly higher vertical level, thereby providing leads 106a–g with undulations 110a–g. Undulations 110a–g and base portions 108a–g provide distal ends 106a–g with effective thicknesses greater than the thicknesses of base portions 108a–g alone. Each of leads 106a–g ramps up in a direction 112 that is parallel to a direction in which members 102a–g generally extend. Thus, the machining of slits 113a–g and the punching of undulations 110a–g is facilitated, i.e., made easier.

As best seen in FIG. 4D, each of members 102a–g is bent at an angle of 90° such that distal ends 106a–g of members 102a–g extend in a direction perpendicular to body 100. As also seen in FIG. 4D, members 102a–g define an imaginary plane 114. As best seen in FIG. 4C, each of members 102a–g follows a bending path, i.e., is nonlinear, in a direction within plane 114.

FIGS. 5A–D illustrate yet another embodiment of a leadframe 118 of the present invention including a body 120 and a plurality of members 122a–g having proximal ends 124a–g and distal ends or "leads" 126a–g. Each of leads 126a–g is corrugated formed such that the leads ramp up from the level of base portions 128a–g to a slightly higher vertical level, and then ramp back down to the level of base portions 128a–g, thereby providing leads 126a–g with undulations 130a–g. Undulations 130a–g and base portions 128a–g provide distal ends 126a–g with effective thicknesses greater than the thicknesses of base portions 128a–g alone. Each of leads 126a–g ramps up and down in a direction 132 that is parallel to a direction in which members 122a–g generally extend. Thus, the punching of undulations 130a–g is facilitated, i.e., made easier.

Figure 5A:
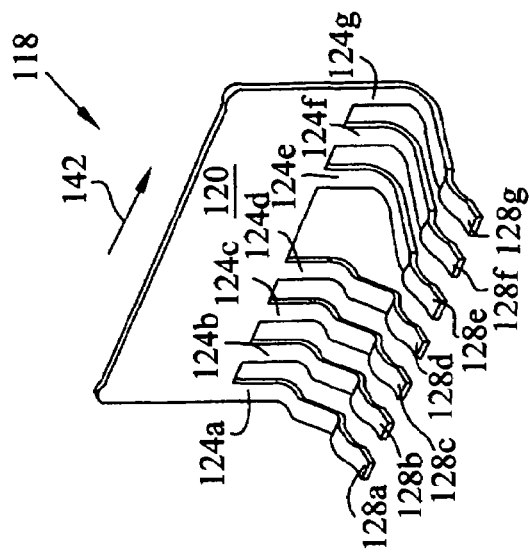
FIG. 5A is a perspective view of yet another embodiment of the leadframe of FIG. 1A.
Figure 5B:
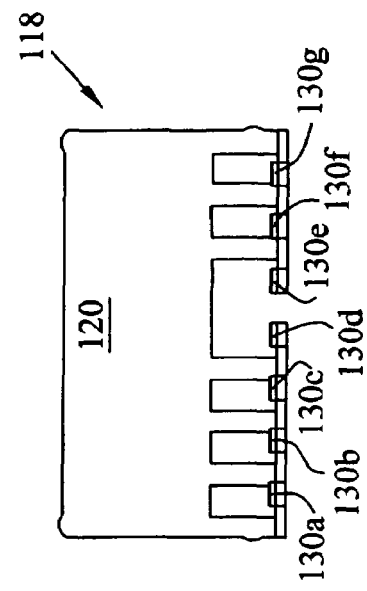
FIG. 5B is a front view of the leadframe of FIG. 5A.
Figure 5C:
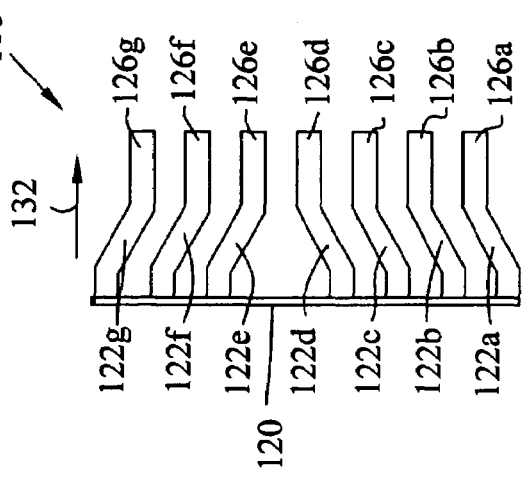
FIG. 5C is a top view of the leadframe of FIG. 5A.
Figure 5D:
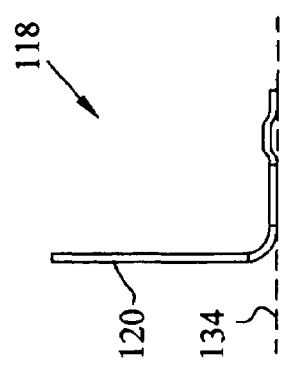
FIG. 5D is a side view of the leadframe of FIG. 5A.

As best seen in FIG. 5D, each of members 122a–g is bent at an angle of 90° such that distal ends 126a–g of members 122a–g extend in a direction perpendicular to body 120. As also seen in FIG. 5D, members 122a–g define an imaginary plane 134. As best seen in FIG. 5C, each of members 122a–g follows a bending path, i.e., is nonlinear, in a direction within plane 134.

Figure 5F:
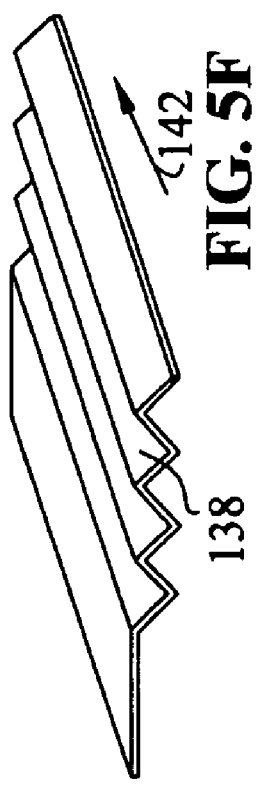
FIG. 5F is a perspective view of yet another embodiment of the distal end of one of the lead frame members of FIG. 5A.
Figure 5G:
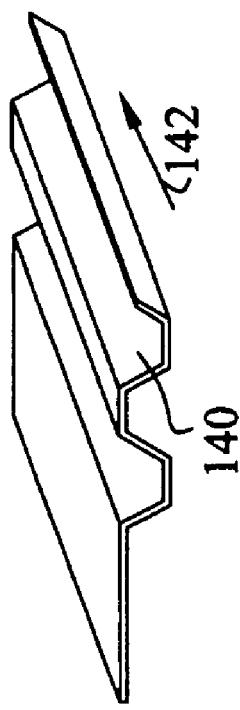
FIG. 5G is a perspective view of a further embodiment of the distal end of one of the lead frame members of FIG. 5A.
Figure 5E:
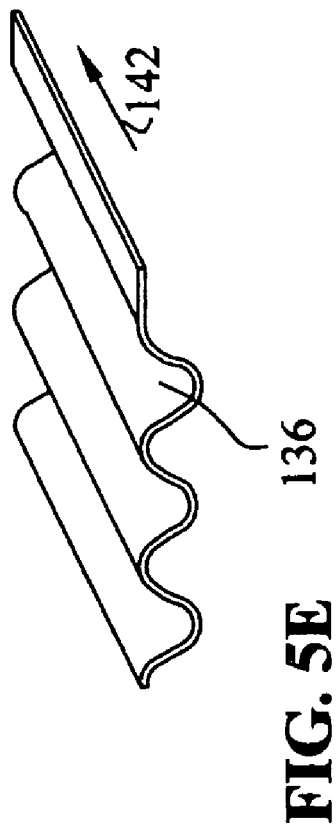
FIG. 5E is a perspective view of another embodiment of the distal end of one of the lead frame members of FIG. 5A.

Various additional embodiments of corrugated formed distal ends 136, 138 and 140 are shown in FIGS. 5E–G. Distal ends of leadframe members may have a single undulation, as is the case with the single undulation 130 on each of members 122a–g in FIGS. 5A–D. Alternatively, distal ends of leadframe member may have multiple undulations, as is the case with each of corrugated formed distal ends 136, 138 and 140. Moreover, the undulations may be in the form of a sinusoidal wave, as with distal end 136; a triangle wave, as with distal end 138; or a substantially square wave, as with distal end 140, for example. A characteristic of corrugated undulations is that the undulation can extend completely across the width of the distal end in direction 142.

FIGS. 6A–D illustrate a further embodiment of a leadframe 148 of the present invention including a body 150 and a plurality of members 152a–g having proximal ends 154a–g and distal ends or "leads" 156a–g. Each of leads 156a–g is squirt formed such that the leads have dome-like bumps, thereby providing leads 156a–g with undulations 160a–g. Undulations 160a–g and base portions 158a–g provide distal ends 156a–g with effective thicknesses greater than the thicknesses of base portions 158a–g alone.

Figures 6A, 6B, 6C, 6D:
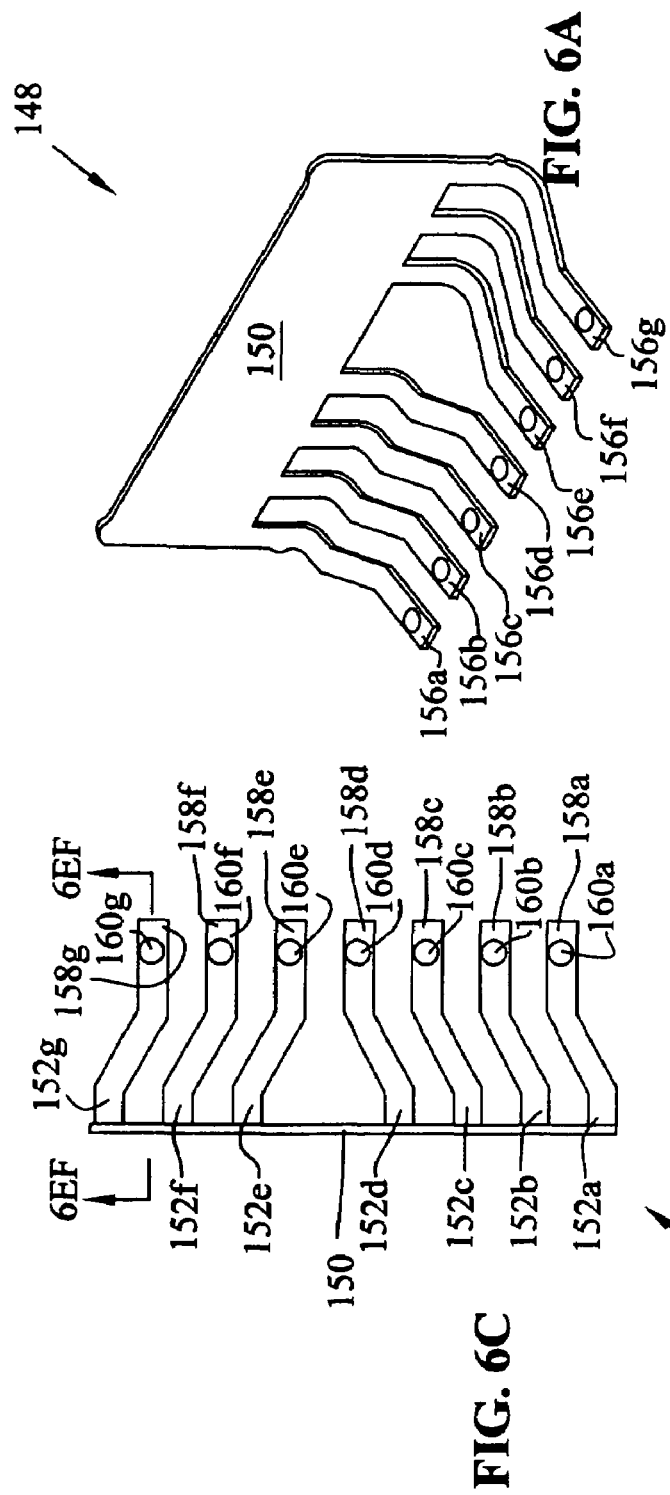
FIG. 6A is a perspective view of a further embodiment of the leadframe of FIG. 1A.
FIG. 6B is a front view of the leadframe of FIG. 6A.
FIG. 6C is a top view of the leadframe of FIG. 6A.
FIG. 6D is a side view of the leadframe of FIG. 6A.

As best seen in FIG. 6D, each of members 152a–g is bent at an angle of 90° such that distal ends 156a–g of members 152a–g extend in a direction perpendicular to body 150. As also seen in FIG. 6D, members 152a–g define an imaginary plane 164. As best seen in FIG. 6C, each of members 152a–g follows a bending path, i.e., is nonlinear, in a direction within plane 164.

As shown in the cross-sectional views of FIGS. 6E–F, the punch of the progressive die may form a squirt formed undulation having a concave, rounded cavity 166 or a trapezoidal cavity 168. Regardless of the shape of the cavity, a characteristic of squirt formed leads is that the depth of the cavity may be less than the thickness of the base portion. For example, the depths of cavities 166, 168 in direction 170 is less than a thickness 172 of respective base portions 174, 176.

FIGS. 7A–D illustrate still another embodiment of a leadframe 178 of the present invention including a body 180 and a plurality of members 182a–g having proximal ends 184a–g and distal ends or "leads" 186a–g. Each of leads 186a–g is embossed formed Such that the leads have bumps that are dome-like with the exception that they can have flat tops 187a–g, thereby providing leads 186a–g with undulations 190a–g. Undulations 190a–g and base portions 188a–g provide distal ends 186a–g with effective thicknesses greater than the thicknesses of base portions 188a–g alone.

Figure 7A:
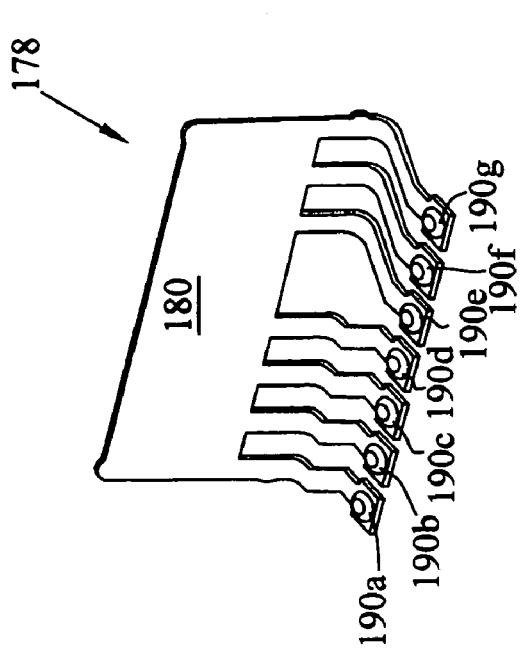
FIG. 7A is a perspective view of still another embodiment of the leadframe of FIG. 1A.
Figure 7B:
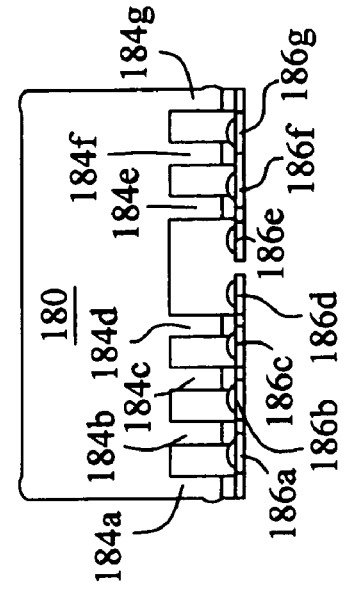
FIG. 7B is a front view of the leadframe of FIG. 7A.
Figure 7C:
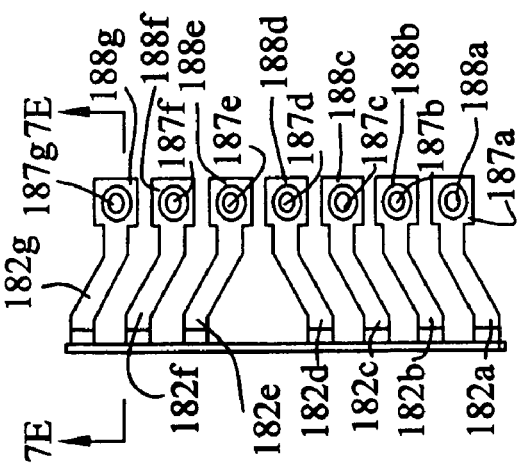
FIG. 7C is a top view of the leadframe of FIG. 7A.
Figure 7D:
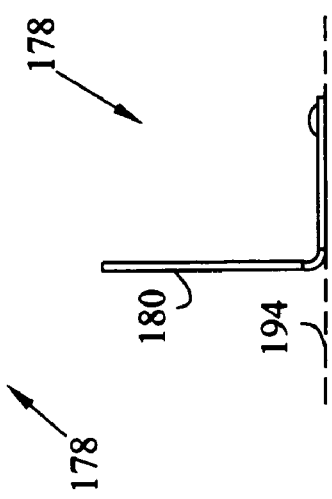
FIG. 7D is a side view of the leadframe of FIG. 7A.

As best seen in FIG. 7D, each of members 182a–g is bent at an angle of 90° such that distal ends 186a–g of members 182a–g extend in a direction perpendicular to body 180. As also seen in FIG. 7D, members 182a–g define an imaginary plane 194. As best seen in FIG. 7C, each of members 182a–g follows a bending path, i.e., is nonlinear, in a direction within plane 194.

As shown in the cross-sectional view of FIG. 7E, an embossed formed undulation can have an effective height 196 that is greater than twice a thickness 198 of a base portion 200. A characteristic of embossed formed leads is that the depth of the cavity may be greater than the thickness of the base portion. For example, the depths of cavity 202 in direction 204 is greater than a thickness 198 of base portion 200.

FIGS. 8A–D illustrate still another embodiment of a leadframe 208 of the present invention including a body 210 and a plurality of members 212a–g having proximal ends 214a–g and distal ends or "leads" 216a–g. Each of leads 216a–g is embossed formed such that the leads have oblong bumps that can have flat tops 217a–g and open ends 219a–g, thereby providing leads 216a–g with undulations 220a–g. Undulations 220a–g and base portions 218a–g provide distal ends 216a–g with effective thicknesses greater than the thicknesses of base portions 218a–g alone.

As best seen in FIG. 8D, each of members 212a–g is bent at an angle of 90° such that distal ends 216a–g of members 212a–g extend in a direction perpendicular to body 210. As also seen in FIG. 8D, members 212a–g define an imaginary plane 224. As best seen in FIG. 8C, each of members 212a–g follows a bending path, i.e., is nonlinear, in a direction within plane 224.

As shown in the cross-sectional view of FIG. 8E, an embossed formed, open-ended undulation can have an effective height 226 that is greater than twice a thickness 228 of a base portion 230. A characteristic of embossed formed leads is that the depth of the cavity may be greater than the thickness of the base portion. For example, the depths of cavity 232 in direction 234 is greater than a thickness 228 of base portion 230.

Figure 9:
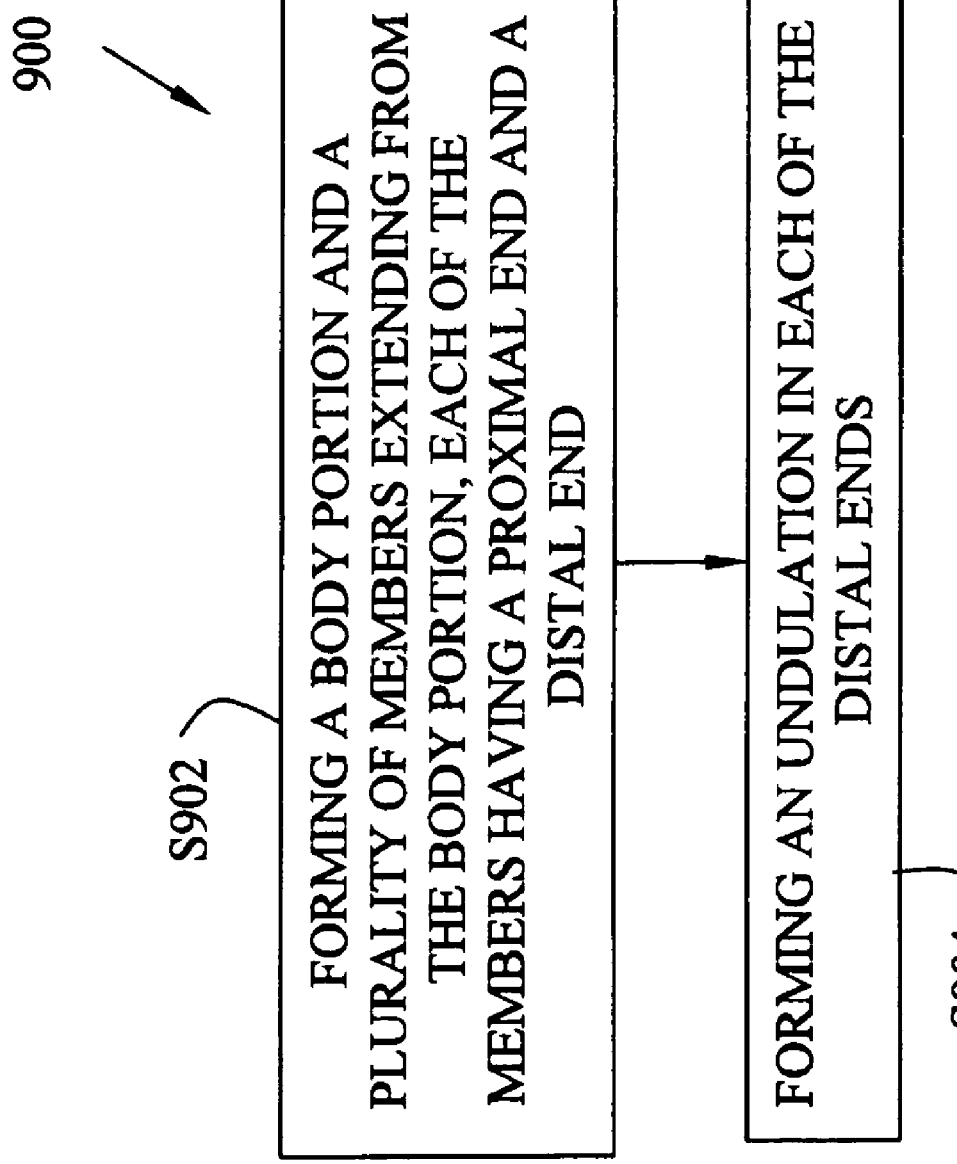
FIG. 9 is a flow chart of one embodiment of a method of manufacturing a lead frame of the present invention.

An embodiment of a method 900 for manufacturing a leadframe of the present invention is illustrated in FIG. 9. In a first step S902, a body portion is formed with a plurality of members extending from the body, with each of the members having a proximal end and a distal end. For example, a progressive die machine, such as machine 62 (FIG. 2) can form a body 80 (FIG. 3A), for example, with members 82a–g extending from body 80. A punch (not shown) that is designed for the particular application can be used in machine 62 to form body 80 and members 82a–g from a sheet of copper stock. Members 82a–g have proximal ends 84a–g and distal ends 86a–g. In a second step S904, an undulation is formed in each of the distal ends. For example, undulations 90a–g can be formed in distal ends 86a–g by inserting in machine 62 a punch (not shown) that is designed to form undulations 90a–g.

Either before or after the forming of the undulations, the leadframe members can be bent at an angle of approximately 90° such that the distal ends of the members extend in a direction substantially perpendicular to the body of the leadframe.

The embodiments disclosed above are not intended to be exhaustive or to limit the invention to the precise forms disclosed in the detailed description. Rather, the embodiments have been chosen and described so that others skilled in the art may utilize their teachings.

Although described in the exemplary embodiments, it will be understood that various modifications may be made to the subject matter without departing from the intended and proper scope of the invention.

What is claimed is:

1. An integrated circuit package, comprising:
   a first non-conductive substrate having a first inner surface;
   at least one first contact pad disposed on said first inner surface for selective electrical communication with circuit elements through conductors carried by said first substrate;
   a second non-conductive substrate having a second inner surface;
   at least one second contact pad disposed on said second inner surface for selective electrical communication with circuit elements through conductors carried by said second substrate, wherein said first and second contact pads are opposed from one another;

a die disposed between said first and second inner surfaces, said die having a first thickness; and a leadframe including a member having a proximal end and a distal end, said proximal end having a second thickness less than said first thickness, said distal end being disposed between said first and second inner surfaces, said distal end being undulated such that said distal end has an effective thickness greater than said second thickness to effect bridging of said opposed contact pads.

2. The package of claim 1, wherein said effective thickness is approximately equal to said first thickness.

3. The package of claim 1, wherein said distal end is one of offset formed, squirt formed, corrugated formed, and embossed formed.

4. The package of claim 1, wherein said at least one first contact pad comprises at least one first bonded copper element, said at least one second contact pad comprises at least one second bonded copper element.

5. The package of claim 1, further comprising:

at least one first layer of conductive attachment material disposed between said at least one first contact pad and each of said distal end of said member and said die; and at least one second layer of conductive attachment material disposed between said at least one second contact pad and each of said distal end of said member and said die.

* * * * *